United States Patent [19]

Cellier et al.

[11] 4,241,308

[45] Dec. 23, 1980

[54] DIGITAL NUMERICALLY CONTROLLED OSCILLATOR

[76] Inventors: Alan M. Lovelace, Administrator of the National Aeronautics and Space Administration, with respect to an invention of Alfred Cellier, Rancho Palos Verdes, Calif.; Douglas C. Huey, Westminster, Calif.; Lit N. Ma, Palos Verdes Estates, Calif.

[21] Appl. No.: 974,475

[22] Filed: Dec. 29, 1978

[51] Int. Cl.³ ............................................. H03K 5/26
[52] U.S. Cl. ................................. 328/55; 328/134; 328/37; 331/48
[58] Field of Search ................... 328/55, 155, 134, 37; 331/48

[56] References Cited

U.S. PATENT DOCUMENTS

| | | | |
|---|---|---|---|
| 3,605,026 | 9/1971 | Bowden | 328/55 X |
| 3,728,635 | 4/1973 | Eisenberg | 328/55 |
| 4,103,251 | 7/1978 | Glick | 328/55 X |
| 4,166,249 | 8/1979 | Lynch | 328/155 |

*Primary Examiner*—John S. Heyman
*Attorney, Agent, or Firm*—Russell E. Schlorff; John R. Manning; Marvin F. Matthews

[57] ABSTRACT

The frequency and phase of an output signal from an oscillator circuit are controlled with accuracy by a digital input word. Positive and negative alterations in output frequency are both provided for by translating all values of input words so that they are positive. The oscillator reference frequency is corrected only in one direction, by adding phase to the output frequency of the oscillator.

The input control word is translated to a single algebraic sign and the digital 1 is added thereto. The translated input control word is then accumulated. A reference clock signal having a frequency at an integer multiple of the desired frequency of the output signal is generated. The accumulated control word is then compared with a threshold level. The output signal is adjusted in a single direction by dividing the frequency of the reference clock signal by a first integer or by an integer different from the first integer.

16 Claims, 3 Drawing Figures

DIGITAL NUMERICALLY CONTROLLED OSCILLATOR

ORIGIN OF THE INVENTION

The invention described herein was made in performance of work under a NASA contract and is subject to the provisions of Section 305 of the National Aeronautics and Space Act of 1958, Public Law 85-568 (72 Stat. 435; 45 U.S.C. 2457).

BACKGROUND OF INVENTION

1. FIELD OF INVENTION

The present invention relates to oscillator circuits for phase-locked loops with digital control of the frequency.

2. DESCRIPTION OF PRIOR ART

Numerically controlled oscillators used in phase-locked loops have in the past been provided with digital control words in order to attempt to duplicate the exact frequency and phase of a noise corrupted input signal. Examples are set forth in U.S. Pat. Nos. 3,422,374; 3,792,378; 3,818,345 and 4,053,879.

The numerically controlled oscillators provided output clock signals at nominal center frequencies plus or minus an amount determined by a digital control number or word applied as an input signal. The digital control word was accumulated in an accumulator until either positive or negative overflow occurred. The accumulator was then reset to zero and the oscillator output signal either delayed or advanced in a phase modulator by an amount of phase corresponding to a single cycle of the oscillator.

Several disadvantages occurred with these oscillators. There was not consistent correspondence between the number removed from the accumulator during reset and the fixed phase added to or subtracted from the oscillator frequency in the phase modulator, resulting in highly undesirable noise in the phase-locked loop. Also, the requirement of both advancing and delaying the phase considerably increased the complexity of circuitry required. Additionally, for output clock nominal frequencies in the range of several hundred kilohertz often used in space craft communication and elsewhere, a reference oscillator frequency in the order of approximately fifty megahertz was required, making digital logic operations quite difficult to perform.

SUMMARY OF INVENTION

Briefly, the present invention provides a new and improved digital numerically controlled oscillator for, and method of, controlling the frequency and phase of an output signal in response to an input control word indicating an adjustment, which may be either a positive or negative adjustment, to be made in the output signal. The input control word is then translated to a single algebraic sign. The translated input control word is then accumulated using a clock which is offset from the desired mean frequency value. The accumulated control word is then compared with a threshold level. When the threshold level is exceeded, the phase, and thus ultimately the frequency, of the output signal is adjusted in a single direction in response to the translated control word. The key simplification results from virtual addition of a bias so as to require only "carries", and never "borrows".

With the present invention several advantages are obtained. For example, a consistent correspondence is achieved between the phase adjustment of the output signal and the amount of accumulated control word removed. Further, prescaling of the input control word is allowed, as well as permitting numbers larger than the threshold to be accumulated with the proper amount of phase change eventually imparted to the output signal.

DESCRIPTION OF PREFERRED EMBODIMENT

Figure 1:
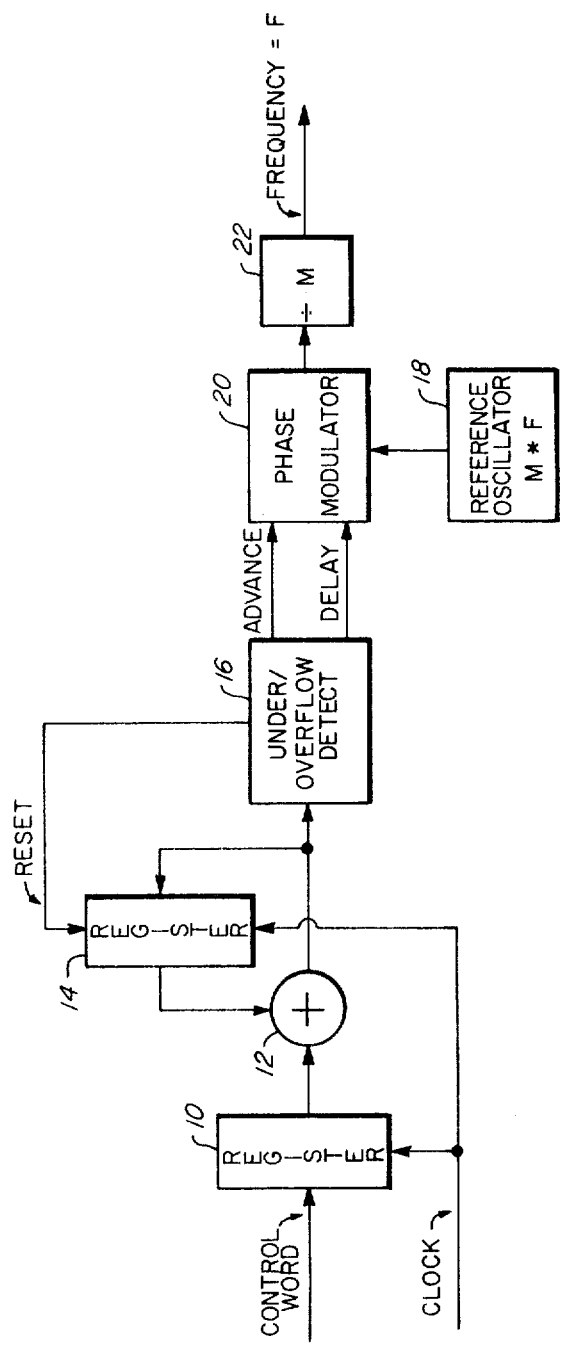
FIG. 1 is a schematic electrical circuit diagram of a prior art numerically controlled oscillator.

At the outset, it is beneficial to consider initially an apparatus A according to prior art (FIG. 1). In such an apparatus, a digital control word is provided as an input to a storage register 10. The digital word is transferred from the storage register 10 through an adding circuit 12 to an accumulator register 14 which is driven by the same clock signal driving the register 10. The register 14 accumulates a digital control word which is provided after each addition in the adder 12 to an under-/overflow detector circuit 16 which detects when a positive or a negative overflow has occurred in the contents of register 14, exceeding a predetermined phase value in either a positive or negative direction.

When a positive overflow is detected by the detector 16, an advance in phase is indicated to be necessary to be applied to a reference oscillator output signal from a reference oscillator 18 by a phase modulator 20. Accordingly, an advance phase signal is sent from the detector 16 to the phase modulator 20 causing the requisite phase advance adjustment to be made to the reference oscillator signal from oscillator 18. At this time, a reset signal is sent to the accumulator register 14, setting the contents of same to zero.

Conversely, when a negative overflow is detected in detector 16, a delay command is provided by detector circuit 16 to the modulator 20, delaying the phase of the output signal from the oscillator 18. Again, at this time, the contents of the register 14 are similarly reset to zero by means of the reset signal from the detector 16.

The phase modulated reference oscillator signal from the phase modulator 20 is furnished to a frequency divider circuit 22 which divides the frequency of such signal down by a suitable factor so that the desired reference operating frequency F is provided from frequency divider circuit 22 and furnished as a reference frequency signal for use in a phase locked loop.

With these types of prior art numerically controlled oscillators, there have been several disadvantages. First, there was not a consistent correspondence between the number removed from the accumulator 14 during reset and the fixed phase added to, or subtracted from, the output of reference oscillator 18 in the phase modulator 20, resulting in highly undesirable noise in the phase-locked loop. Furthermore, since the phase had to be either advanced or delayed in accordance with the type of overflow from the register 14, the complexity of circuitry required to implement such bidirectional phase adjustments in these prior art oscillators was often considerable.

Considering now the present invention (FIG. 2), a new and improved digital numerically controlled oscillator O is set forth. In the oscillator O, a digital control word indicating the adjustment to be made to the reference oscillator frequency output from an oscillator 30 is received in a register 32. The input control word received in register 32 may indicate either a positive adjustment or advance, i.e. a negative adjustment or delay, to be made to the reference oscillator output. The contents from the register 32 are transferred to an accumulator register 34 through digital functions 36, 38, 40 and 52. The accumulator register 34 receives and stores therein a current running total of digital control words received by the register 32, as modified by the digital circuits 36, 38, 40 and 52.

The adder circuit 36 serves to translate the input control word received at the register 32 to a single algebraic sign. In this manner, the oscillator O of the present invention thereafter adjusts the frequency and phase of the output signal from oscillator 30 in a single direction, that of adding phase to the output signal. Specifically, for digital input control words received at the register 32, the adder 36 translates such words to a positive algebraic sign by adding a significant digital "1" to the input control word; using the convention that the digital input control word received at register 32 is a fractional number in the range −1 to +1.

The output from the adder circuit 36 is furnished to a multiplier circuit 38 which applies a prescaling factor to the translated input control word from the register 32. The prescaling factor is one selected, as will be set forth below, based on the desired operating characteristic of the oscillator O. The output of the multiplier 38 is furnished to an adder circuit 40, which adds the present contents of the accumulator register 34, modified by adder 52, to the output from multiplier 38, incrementing the contents of the accumulator register 34 to thus represent the accumulated contents for the new operating cycle. The registers 32 and 34 receive input signals and transfer output signals under control of a clock signal which thus controls operating cycles.

The output of the adder 40 for each cycle is provided to an adder circuit 42 at a positive input thereof, while a threshold amount, representing the amount which must be exceeded in order for the phase of the signal from the oscillator 30 to be adjusted, is provided to a negative input thereof. Accordingly, the adder 42 subtracts the threshold amount from the contents of the accumulator register 34 to form a difference signal. The difference signal from the adder 42 is provided to a threshold detector circuit 44 which detects when the difference signal from the adder 42 is greater than zero. When the detector 44 detects that the difference signal from the adder 42 is greater than zero the threshold has been exceeded, and a signal is formed in detector circuit 44 to activate a frequency divide counter circuit 46 as well as a multiplexer 48.

The frequency divider circuit 46 normally divides the output frequency from the oscillator 30 by a factor of K so that in conjunction with a further divide by N circuit 50, the frequency of the oscillator 30, namely $(NK+1) \times F_s$, closely represents the desired output frequency $F_s$. It is to be noted that were this $(NK+1) \times F_s$ frequency from oscillator 30 continuously divided by NK a frequency error would exist and the output of the divider 50 would not be at the desired frequency $F_s$. Thus, when the detector circuit 44 detects that the threshold has been exceeded, the divider 46 divides the frequency from the oscillator 30 by a different integer, namely K+1, for one cycle, thus inserting an extra reference oscillator period in the output signal from the divider 50, and compensating for what might otherwise be a frequency error.

It should be understood that the dividing integers of K and K+1 in the divider 46 are merely set forth by way of example and that others may be used depending upon the particular input control word applied to the register 32 and scale factor applied by the scaling multiplier 38, as will be set forth below.

The multiplexer 48 normally furnishes a digital "0" value furnished thereto at its A input to an adder 52 so that the contents of the accumulator register 34 are not disturbed. However, when the detector 44 detects that the threshold has been exceeded, the multiplexer 48 responds to the signal from the detector 44 and furnishes a threshold signal "−TH" present at it B input to the adder 52, thereby subtracting the threshold signal from the register 34.

Figure 2:
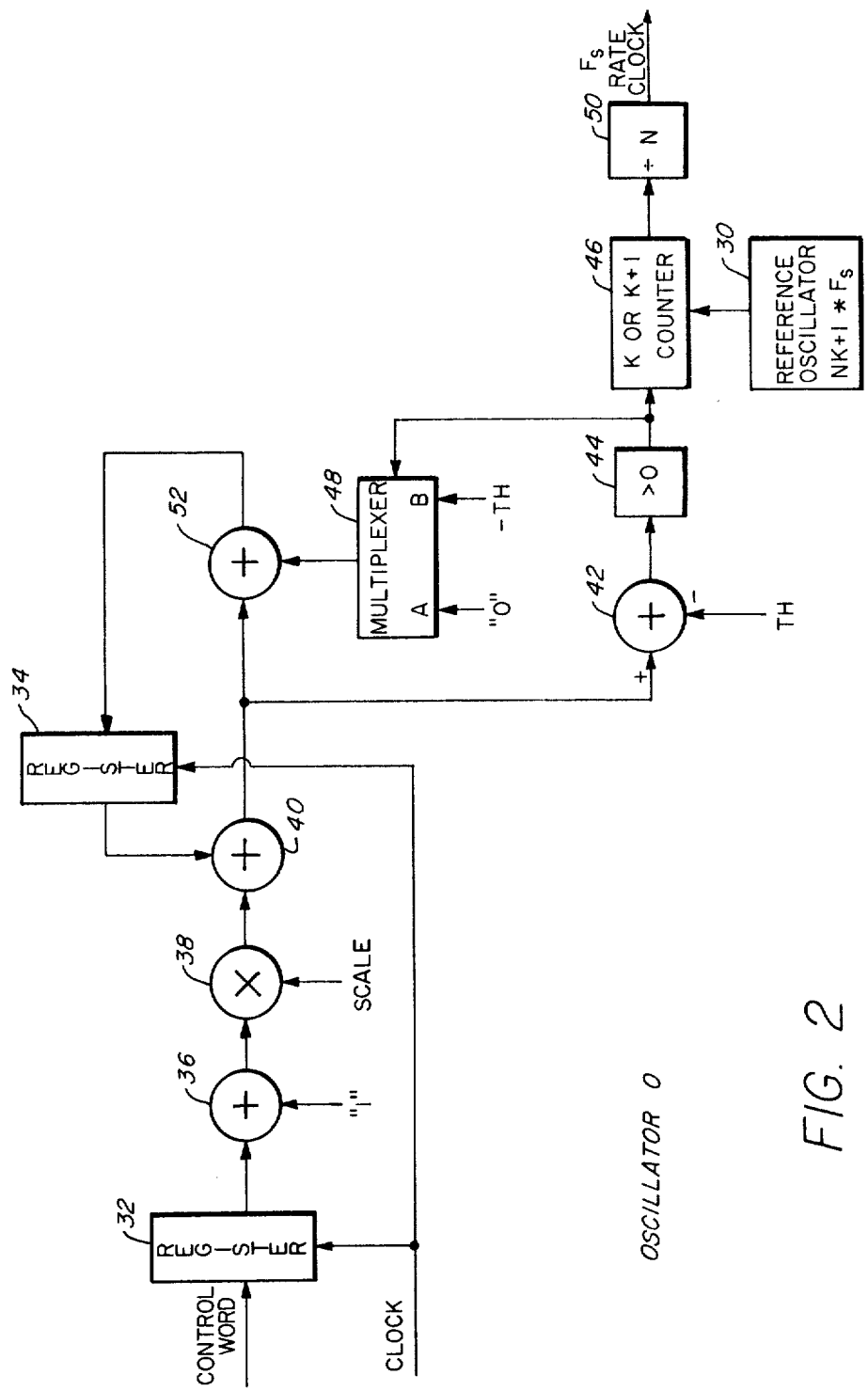
FIGS. 2 and 3 are schematic electrical circuit diagrams of numerically controlled oscillators according to the present invention.

An oscillator O-1 (FIG. 3) of the present invention illustrates the advantages of the present invention, showing the simplicity of implementation of the circuit shown functionally in FIG. 2, and how such implementation may be achieved with few integrated circuits. In the apparatus O-1 the scaling constant is restricted to being a negative power of two, such as $2^{-1}$, and threshold is set to be 1.0.

In the oscillator O-1, a 16 bit scaled input containing bits $C2^0$ through $C2^{-15}$ is provided to a bank of sixteen digital summing circuits 60. The summing circuit 60 receiving the least significant bit of the scaling constant $C2^{-15}$ also receives a digital "0" at a carry input.

Each of the digital summing circuits 60 sums the bit of the scaling constant presented thereto with the present contents of a bank of accumulator registers 62, one for each bit in the scaling constant. For example, the summing circuit 60 receiving the scaling constant bit $C2^{-1}$ adds this signal, together with a carry signal from the next less significant bit, and with a digital signal $S2^{-2}$ from a storage accumulator register 62. The result of such addition is furnished to the storage register 62 for the next addition operation, and any carry signal resulting from such addition is provided as a carry input to the next most significant bit adder 60, having $C2^0$ and $S2^{-1}$ as its other inputs.

It is to be noted that each of the bits of the input word $C2^0$ through $C2^{-15}$ is shifted right by one bit, being added to the contents $S2^{-1}$ through $S2^{-16}$, respectively. Further, the register 62 carrying the most significant bit is provided with no input signal and the most significant bit is thus made a constant digital "0". Finally, the next most significant bit $S2^{-1}$ is inverted by means of an inverter 64 connected between the input for the control bit $C2^0$ and the adder circuit 60. In this manner, the most significant bit $S2^0$ of the accumulator bank 62 becomes the carry logic from the bank of summing circuits 60.

A threshold detector 66 thus examines the carry bit out of the most significant adder 60. If the detector circuit 66 detects a "1", a divide by four counter portion thereof is instructed to divide by four in frequency the output frequency of a reference oscillator providing an output frequency of 193 $F_s$ for one cycle, thus inserting an extra reference oscillator period. If the detector 66 detects a "0" from the most significant adder, the output frequency of the oscillator 68 is divided by three. The divided frequency output from the detector circuit 66 is furnished to a divide by 64 circuit 70 which divides the signal furnished thereto from the detector circuit 66 in frequency by 64 to obtain an output frequency at the desired rate clock frequency of $F_s$.

Figure 3:
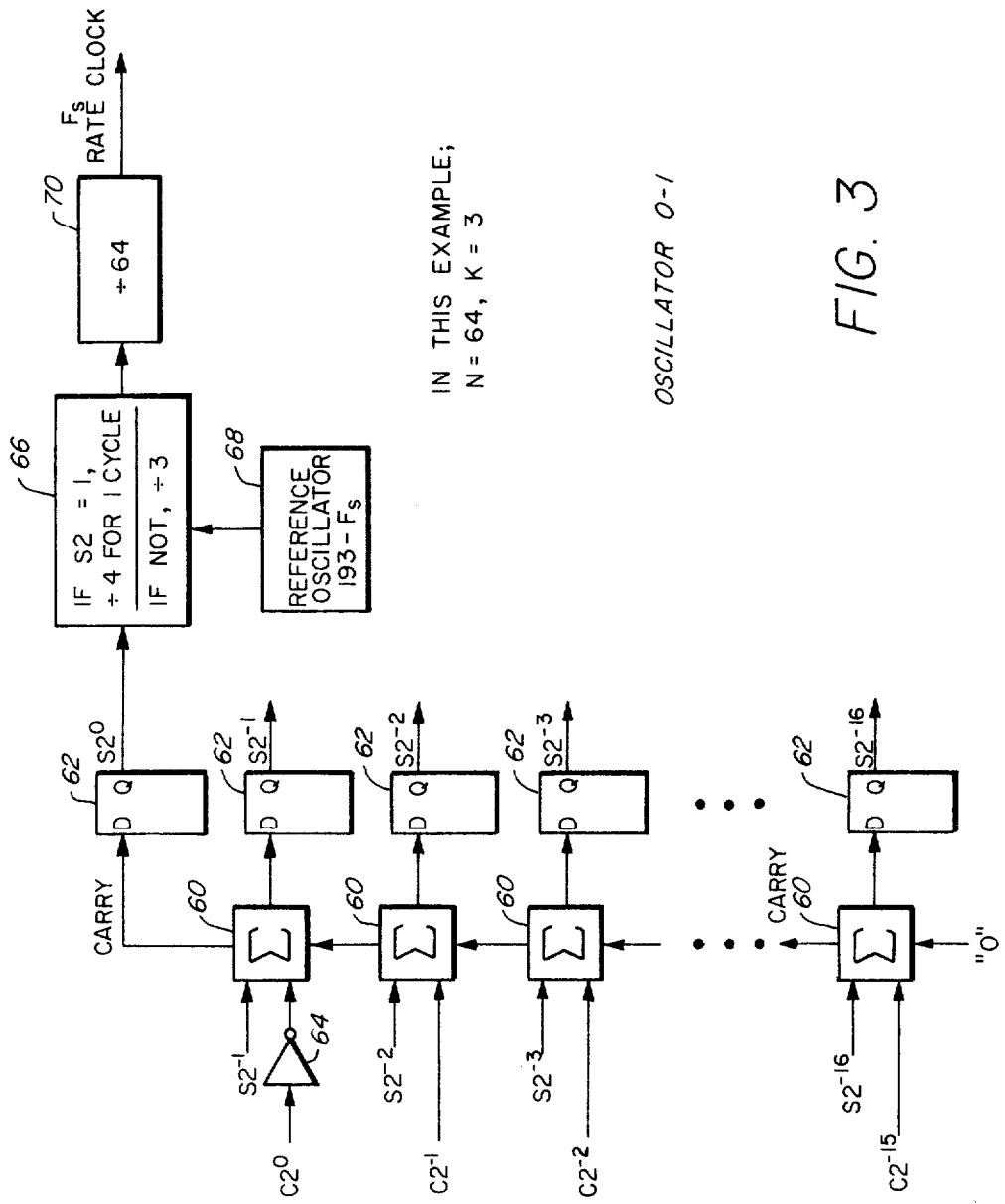

In the oscillator O-1, it is to be noted that subtraction of the threshold from the accumulator bank 62 when it has been exceeded requires no digital circuitry, since the natural result in any binary number system of the type shown in FIG. 3 when an overflow occurs is to subtract such a threshold as long as the threshold has value 1.

It is to be noted that in both oscillators O and O-1 of the present invention, an output clock frequency $F_s$ at a nominal frequency is provided. Further, it is to be noted that the oscillators of the present invention do not reset the accumulator when a positive or negative overflows occurs and then delay or advance the frequency $F_s$ by the phase corresponding to a single cycle of a reference oscillator. With the present invention, the oscillators O and O-1 provide for positive and negative output frequency alterations by translating a 1 input numbers so that they are positive, by means of adding "1" and by increasing the reference oscillator frequency to be such that corrections in only one direction, namely adding phase to the rate clock $F_s$ are made.

With a suitably chosen control word, such as 0.0, applied to the input, carries as output signals from the summing circuits 60 occur at a rate such that the effect of dividing by three or dividing by four in the frequency divider circuits in response to the detection of an overflow, followed by dividing by sixty-four in the circuits 50 and 70, respectively, produces an average dividing ratio of 193. Thus, the reference oscillator frequencies of 193 $F_s$ of the oscillators 30 and 68 are precisely numerically controlled in the oscillators O and O-1 of the present invention to yield a rate clock of $F_s$. The present invention thus has the advantage of providing consistent correspondence between the phase alterations in the $F_s$ clock output and the numerical amount removed from the accumulators 34 and 62. Further, the oscillators of the present invention also have the advantage of easily allowing prescaling and allowing numbers larger than the threshold to be added into the accumulators thereof and the proper amount of phase change eventually is still imparted to the output clock $F_s$.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

I claim:

1. A digital numerically controlled oscillator for controlling the frequency and phase of an output signal in response to an input control word, comprising:
   (a) means for translating the input control word to a single algebraic sign;
   (b) means for accumulating the translated input control word;
   (c) means for sensing when a threshold amount is achieved in said means for accumulating;
   (d) means for forming a reference clock signal having a frequency at an integer multiple of the desired frequency of the output signal, and
   (e) means responsive to said means of or sensing for adjusting the frequency and phase of the output signal in a single direction in response to the translated control word, said means including:
      (1) means for dividing the frequency of the reference clock signal by a first integer; and
      (2) means for dividing the frequency of the reference clock signal by an integer different from said first integer in response to said means for sensing.

2. The apparatus of claim 1, wherein said means for translating comprises:
   means for translating the input control word to a positive algebraic sign.

3. The apparatus of claim 2, wherein the input control word is digital and said means for translating comprises:
   means for adding digital 1 to the input control word.

4. The apparatus of claim 2, wherein said means for adjusting comprises:
   means for adding phase to the output signal.

5. The apparatus of claim 1, further including:
   means for adding a threshold level signal to the contents of said means for accumulating.

6. The apparatus of claim 1, wherein said means for sensing comprises:
   (a) means for subtracting the threshold amount from the contents of said means for accumulating to thereby form a difference signal;
   (b) means for detecting when the difference signal is greater than zero, said means for detecting forming a signal to activate said means for adjusting when the difference signal is greater than zero.

7. The apparatus of claim 1, further including:
   means for multiplying the input control word by a prescaling factor.

8. The apparatus of claim 7, wherein said means for adding comprises:
   means for multiplying the input control word by a negative power of two.

9. A method of digital numerical control of the frequency and phase of an output signal from an oscillator in response to an input control word, comprising the steps of:
   (a) translating the input control word to a single algebraic sign;
   (b) accumulating the translated input control word;
   (c) sensing when a threshold amount is achieved in accumulated input control word;
   (d) forming a reference clock signal having a frequency at an integer multiple of the desired frequency of the output signal; and
   (e) adjusting the frequency and phase of the output signal in a single direction in response to the accumulated translated control word including:
      (1) dividing the frequency of the reference clock signal by a first integer; or
      (2) dividing the frequency of the reference clock signal by an integer different from said first integer in response to said step of sensing.

10. The method of claim 9, wherein said step of translating comprises:
    translating the input control word to a positive algebraic sign.

11. The method of claim 10, wherein the input control word is digital and said step of translating comprises:
    adding digital 1 to the input control word.

12. The method of claim 10, wherein said step of adjusting comprises:
    adding phase to the output signal.

13. The method of claim 9, further including the step of:

adding a threshold level signal to the accumulated input control word.

14. The method of claim 9, wherein said step of sensing comprises:
   (a) subtracting the threshold amount from the accumulated input control word to thereby form a difference signal;
   (b) detecting when the difference signal is greater than zero; and,
   (c) forming a signal to begin said step of adjusting when the difference signal is greater than zero.

15. The method of claim 9, further including the step of:
   multiplying the input control word by a prescaling factor.

16. The method of claim 15, wherein said step of multiplying comprises:
   shifting the input control word to scale by a negative power of two.

* * * * *